US012418983B2

(12) United States Patent
Noguchi et al.

(10) Patent No.: US 12,418,983 B2
(45) Date of Patent: Sep. 16, 2025

(54) ELECTRONIC MODULE AND APPARATUS (71) Applicant: CANON KABUSHIKI KAISHA, Tokyo (JP)

(72) Inventors: Koji Noguchi, Tokyo (JP); Satoru Higuchi, Tokyo (JP); Mitsutoshi Hasegawa, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 268 days.

(21) Appl. No.: 18/187,311

(22) Filed: Mar. 21, 2023

(65) Prior Publication Data

US 2023/0319996 A1    Oct. 5, 2023

(30) Foreign Application Priority Data

Mar. 30, 2022    (JP) .................................. 2022-056601

(51) Int. Cl.
*H05K 1/18* (2006.01)
*H05K 1/14* (2006.01)

(52) U.S. Cl.
CPC ............. *H05K 1/147* (2013.01); *H05K 1/181* (2013.01)

(58) Field of Classification Search
CPC .............................. H05K 1/147; H05K 1/181
USPC ......................................................... 361/749
See application file for complete search history.

(56) References Cited

U.S. PATENT DOCUMENTS 6,829,398 B2 * 12/2004 Ouchi .................. G02B 6/4214
385/129

FOREIGN PATENT DOCUMENTS

| JP | H0685454 A | 3/1994 |
|---|---|---|
| JP | H1027957 A | 1/1998 |
| JP | 2006245108 A | 9/2006 |
| JP | 2006253569 A | 9/2006 |
| JP | 2008112911 A | 5/2008 |
| JP | 2012195538 A | 10/2012 |
| JP | 2017017318 A | 1/2017 |
| JP | 2021168378 A | 10/2021 |

* cited by examiner

*Primary Examiner* — Binh B Tran
(74) *Attorney, Agent, or Firm* — Canon U.S.A., Inc. IP Division (57) ABSTRACT

An electronic module includes a rigid printed circuit member having a first electrode, a flexible printed wiring member having a second electrode, and a solder member having first, second, and third portions. A first direction is perpendicular to, and a second direction is parallel to, a joined surface between the first electrode and the solder member. In the first direction, a second region of the first electrode partially overlaps a leading edge of the second electrode. In the second direction, the second portion is located between the first portion and the third portion and is continuous to each of the first portion and the third portion. A height of the third portion from a reference surface including the joined surface is larger than a height of the second portion from the reference surface and is smaller than a height of the first portion from the reference surface.

28 Claims, 7 Drawing Sheets

ELECTRONIC MODULE AND APPARATUS

BACKGROUND

Field

The present disclosure relates to an electronic module having a configuration in which a flexible printed wiring member is joined to a rigid printed wiring member with solder.

Description of the Related Art

A technique for joining a flexible printed wiring member to a rigid printed wiring member with solder is known. Japanese Patent Application Laid-Open No. 2021-168378 discusses an imaging sensor module having a configuration in which a flexible wiring board is connected to a printed wiring board with solder at a connection portion.

In the technique for joining a flexible printed wiring member to a rigid printed wiring member with solder, it is desirable to improve the strength of the connection portion between the printed wiring board and the flexible wiring substrate.

SUMMARY

The present disclosure is directed to providing a technique advantageous in improving a connection strength between a rigid printed wiring member and a flexible printed wiring member.

According to an aspect of the present disclosure, an electronic module includes a rigid printed circuit member including a first electrode, a flexible printed wiring member including a second electrode, and a solder member joined to each of the first electrode and the second electrode, wherein, in a case where a direction perpendicular to a joined surface between the first electrode and the solder member is a first direction and a direction parallel to the joined surface between the first electrode and the solder member is a second direction, the solder member includes a first portion located between the rigid printed circuit member and a first region of the second electrode in the first direction, wherein the first portion includes one end of a joined surface between the second electrode and the solder member, a second portion located between a first region of the first electrode and a second region of the second electrode in the first direction, and a third portion located on a second region of the first electrode in the first direction, wherein the third portion includes one end of the joined surface between the first electrode and the solder member, wherein, in the first direction, the second region of the first electrode partially overlaps a leading edge of the second electrode, wherein, in the second direction, the second portion is located between the first portion and the third portion and is continuous to each of the first portion and the third portion, and wherein a height of the third portion from a reference surface including the joined surface between the first electrode and the solder member is larger than a height of the second portion from the reference surface and is smaller than a height of the first portion from the reference surface.

Further features of the present disclosure will become apparent from the following description of exemplary embodiments with reference to the attached drawings.

DESCRIPTION OF THE EMBODIMENTS

Exemplary embodiments of the present disclosure will be described below with reference to the drawings. In the following description and the drawings, components common among a plurality of drawings are denoted by the same reference numerals.

Accordingly, the common components will be described with cross reference to a plurality of drawings, and the description of the components denoted by the same reference numerals will be omitted as appropriate.

Figure 1A:
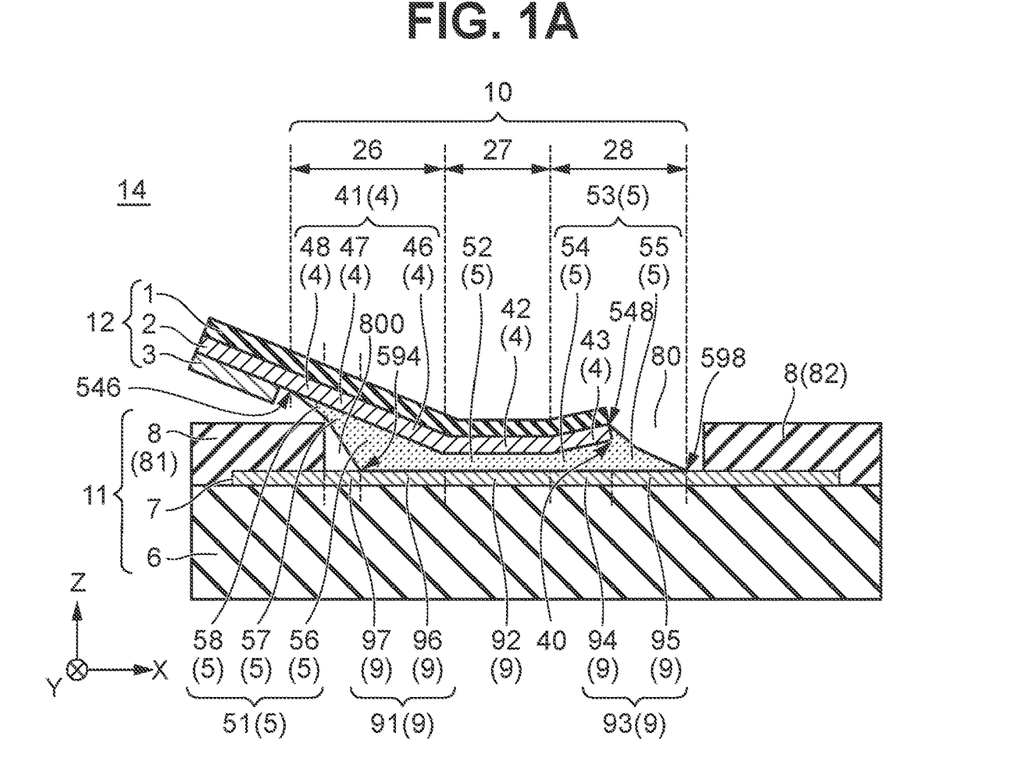
FIGS. 1A and 1B are schematic views each illustrating an electronic module.
Figure 1B:
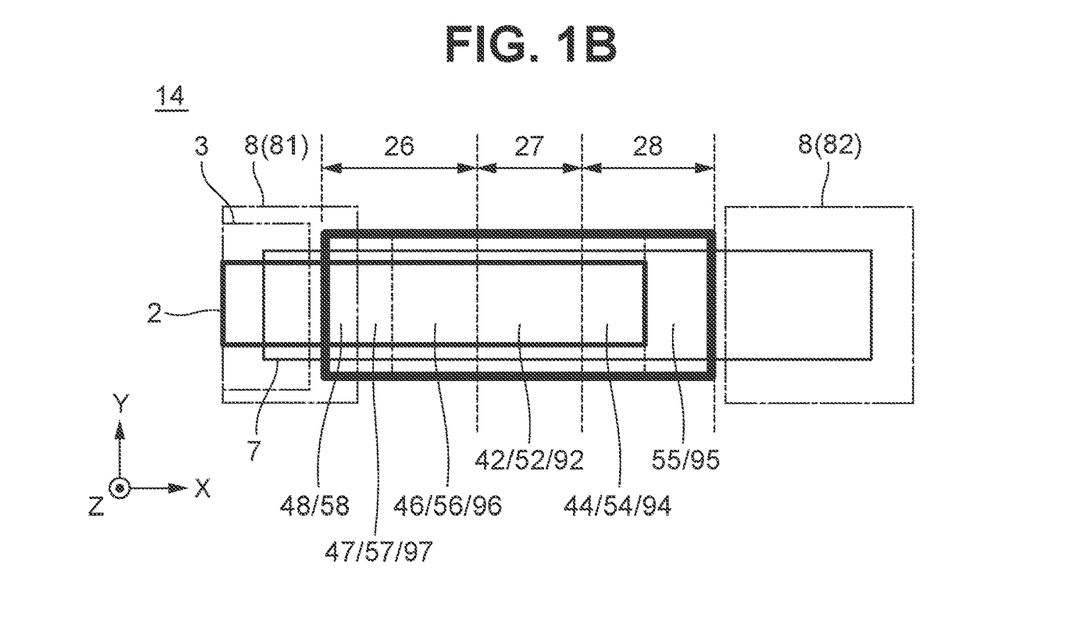

FIGS. 1A and 1B are partially enlarged schematic views of an electronic module 14. The electronic module 14 includes a circuit member 11 and a wiring member 12. The circuit member 11 includes a pad electrode 9. The wiring member 12 includes a connection electrode 4. The electronic module 14 includes a solder member 5 that is joined to each of the pad electrode 9 and the connection electrode 4. The circuit member 11 and the wiring member 12 are electrically and mechanically connected with the solder member 5. FIG. 1A is an enlarged view of a connection portion 10 that includes the solder member 5 and electrically and mechanically connects the circuit member 11 and the wiring member 12. The circuit member 11 is a rigid printed circuit member. The rigid printed circuit member is hereinafter abbreviated as the circuit member 11. The circuit member 11 is called a printed circuit board (PCB), and is also called a rigid printed wiring member. A predetermined wiring pattern is formed on the circuit member 11. Circuit components, such as integrated circuit components and passive components, are mounted on the circuit member 11. The wiring member 12 is a flexible printed wiring member. The flexible printed wiring member is hereinafter abbreviated as the wiring member 12. The wiring member 12 has a configuration in which a predetermined wiring pattern is formed on a flexible insulating substrate. The wiring member 12 is called flexible printed circuits (FPC), and is also called a flexible printed circuit member. Two or more wiring members 12 can be connected to the circuit member 11.

The circuit member 11 includes an insulating substrate 6 and a conductive layer 7 that is supported on the insulating substrate 6. An insulating layer 8 covers each of the insulating substrate 6 and the conductive layer 7. The insulating layer 8 is provided with an opening 80 between a backward insulating portion 81 and a forward insulating portion 82 of the insulating layer 8. The pad electrode 9 corresponds to a portion of the conductive layer 7 that is not covered with the insulating layer 8, that is, a portion located below the opening 80. At least a part of the solder member 5 is located between the backward insulating portion 81 of the insulating layer 8 and the forward insulating portion 82 of the insulating layer 8.

The wiring member 12 includes an insulating base material 1 and a wiring layer 2 supported on the insulating base material 1. A cover lay 3 covers the insulating base material 1 and the wiring layer 2. The wiring layer 2 is located between the insulating base material 1 and the cover lay 3. The connection electrode 4 corresponds to a portion of the wiring layer 2 that is not covered with the cover lay 3.

The following description is given assuming that a direction perpendicular to a joined surface between the pad electrode 9 and the solder member 5 is defined as a Z-direction, and directions parallel to the joined surface between the pad electrode 9 and the solder member 5 are defined as an X-direction and a Y-direction. The X-direction and the Y-direction cross the Z-direction or are typically perpendicular to the Z-direction. In the X-direction, the backward insulating portion 81 and the forward insulating portion 82 are located side by side through the opening 80. The direction that crosses the X-direction is defined as the Y-direction. The direction that crosses the X-direction is typically perpendicular to the Y-direction. A +X-direction is referred to as a forward direction and a −X-direction is referred to as a backward direction.

An exemplary embodiment is described assuming that the connection portion 10 is divided into a plurality of regions in the X-direction. The connection portion 10 is divided into a backward region 26, an intermediate region 27, and a forward region 28. The intermediate region 27 is located between the backward region 26 and the forward region 28. The forward region 28 includes a leading edge of the connection electrode 4.

The intermediate region 27 can be continuous to each of the backward region 26 and the forward region 28. The backward region 26, the intermediate region 27, and the forward region 28 each include a region or a portion where the pad electrode 9 or the solder member 5 overlaps the corresponding connection electrode 4 in the Z-direction.

The backward region 26 includes a backward region 91 of the pad electrode 9, a backward region 41 of the connection electrode 4, and a backward portion 51 of the solder member 5. The backward region 91 of the pad electrode 9 includes a first backward region 96 and a second backward region 97. The backward region 41 of the connection electrode 4 includes a first backward region 46, a second backward region 47, and a third backward region 48. The backward portion 51 of the solder member 5 includes a first backward portion 56, a second backward portion 57, and a third backward portion 58.

In the X-direction, the first backward region 96 is located between the second backward region 97 and an intermediate region 92. The first backward region 96 is continuous to each of the second backward region 97 and the intermediate region 92. The second backward region 47 is located between the first backward region 46 and the third backward region 48. The second backward region 47 can be continuous to each of the first backward region 46 and the third backward region 48. The first backward region 46 is located between the second backward region 47 and an intermediate region 42. The first backward region 46 can be continuous to each of the second backward region 47 and the intermediate region 42. The second backward portion 57 is located between the first backward portion 56 and the third backward portion 58. The second backward portion 57 can be continuous to each of the first backward portion 56 and the third backward portion 58. In the X-direction, the first backward portion 56 is located between the second backward portion 57 and an intermediate portion 52. The first backward portion 56 can be continuous to each of the second backward portion 57 and the intermediate portion 52.

In the Z-direction, the backward portion 51 of the solder member 5 is located between the circuit member 11 and the backward region 41 of the connection electrode 4. The backward portion 51 is joined to each of the backward region 41 and the backward region 91. In the Z-direction, the first backward portion 56 of the solder member 5 is located between the first backward region 96 of the pad electrode 9 and the first backward region 46 of the connection electrode 4. In the Z-direction, the second backward portion 57 of the solder member 5 is located between the second backward region 97 of the pad electrode 9 and the second backward region 47 of the connection electrode 4.

The first backward portion 56 is joined to each of the first backward region 46 and the first backward region 96. In contrast, the second backward portion 57 is joined to the second backward region 47 and is spaced apart from the second backward region 97.

A boundary portion between the first backward region 96 and the second backward region 97 can be determined based on whether these regions are joined with the solder member 5. Specifically, in the backward region 91, the first backward region 96 is joined with the solder member 5 and the second backward region 97 is not joined with the solder member 5.

In the Z-direction, the third backward portion 58 of the solder member 5 is located between the backward insulating portion 81 of the insulating layer 8 and the third backward region 48 of the connection electrode 4. The third backward portion 58 is joined to the third backward region 48. In the Z-direction, the backward insulating portion 81 of the insulating layer 8 is located between the conductive layer 7 and the backward portion 51. Specifically, in the Z-direction, the backward insulating portion 81 of the insulating layer 8 is located between the conductive layer 7 and the third backward portion 58. A boundary portion between the second backward region 47 and the third backward region 48 can be determined based on whether these regions overlap the insulating layer 8. Specifically, in the backward region 41, the third backward region 48 overlaps the insulating layer 8 and the second backward region 47 does not overlap the insulating layer 8.

The intermediate region 27 includes the intermediate region 92 of the pad electrode 9, the intermediate region 42 of the connection electrode 4, and the intermediate portion 52 of the solder member 5.

In the X-direction, the intermediate region 92 of the pad electrode 9 is located between the backward region 91 of the pad electrode 9 and a forward region 93 of the pad electrode 9. The intermediate region 92 of the pad electrode 9 can be continuous to each of the backward region 91 of the pad electrode 9 and the forward region 93 of the pad electrode 9. In the X-direction, the intermediate portion 52 of the solder member 5 is located between the backward portion 51 of the solder member 5 and a forward portion 53 of the solder member 5. The intermediate portion 52 of the solder member 5 can be continuous to each of the backward portion 51 of the solder member 5 and the forward portion 53 of the solder member 5.

In the Z-direction, the intermediate portion 52 of the solder member 5 is located between the intermediate region 92 of the pad electrode 9 and the intermediate region 42 of the connection electrode 4. The intermediate portion 52 is joined to each of the intermediate region 42 and the intermediate region 92.

The forward region 28 includes the forward region 93 of the pad electrode 9, a forward region 43 of the connection electrode 4, and the forward portion 53 of the solder member 5. The forward region 28 and the forward region 43 each include a leading edge 40 of the connection electrode 4. The forward region 93 of the pad electrode 9 includes a first forward region 94 and a second forward region 95. The forward portion 53 of the solder member 5 includes a first forward portion 54 and a second forward portion 55.

In the X-direction, the first forward region 94 is located between the second forward region 95 and the intermediate region 92. The first forward region 94 can be continuous to the second forward region 95 and the intermediate region 92. In the X-direction, the first forward portion 54 is located between the second forward portion 55 and the intermediate portion 52. The first forward portion 54 can be continuous to each of the second forward portion 55 and the intermediate portion 52.

In the Z-direction, the forward portion 53 of the solder member 5 is located above the forward region 93 of the pad electrode 9. In the Z-direction, the leading edge 40 of the connection electrode 4 is located above the forward region 93 of the pad electrode 9. Accordingly, in the Z-direction, a part of the forward region 93 of the pad electrode 9 overlaps the leading edge 40 of the connection electrode 4. A part of the forward region 93 of the pad electrode 9 that overlaps the leading edge 40 of the connection electrode 4 can correspond to a boundary portion between the first forward region 94 and the second forward region 95. In the Z-direction, the first forward portion 54 of the solder member 5 is located between the first forward region 94 of the pad electrode 9 and the forward region 43 of the connection electrode 4. In the Z-direction, the second forward portion 55 of the solder member 5 is located above the second forward region 95 of the pad electrode 9, does not overlap the connection electrode 4, and is not located between the connection electrode 4 and the pad electrode 9. The boundary portion between the first forward region 94 and the second forward region 95 can be determined based on whether these regions overlap the connection electrode 4. Specifically, in the forward region 93, the first forward region 94 overlaps the connection electrode 4 and the second forward region 95 does not overlap the connection electrode 4.

The backward portion 51 includes one end 546 of a joined surface between the solder member 5 and the connection electrode 4. In the present exemplary embodiment, the third backward portion 58 includes the one end 546 of the joined surface between the solder member 5 and the connection electrode 4. The forward portion 53 includes another end 548 of the joined surface between the solder member 5 and the connection electrode 4. In the present exemplary embodiment, the second forward portion 55 includes the other end 548 of the joined surface between the solder member 5 and the connection electrode 4.

The forward portion 53 includes one end 598 of a joined surface between the solder member 5 and the pad electrode 9. In the present exemplary embodiment, the second forward portion 55 includes the one end 598 of the joined surface between the solder member 5 and the pad electrode 9. The backward portion 51 includes another end 594 of the joined surface between the solder member 5 and the pad electrode 9. In the present exemplary embodiment, the third backward portion 58 includes the other end 594 of the joined surface between the solder member 5 and the pad electrode 9.

As described above, the backward portion 51 ranges from the boundary between the backward portion 51 and the intermediate portion 52 to the one end 546. The forward portion 53 ranges from the boundary between the forward portion 53 and the intermediate portion 52 to the one end 598.

In the X-direction, the backward portion 51 is located between the backward insulating portion 81 and the intermediate portion 52. In the X-direction, the forward portion 53 is located between the forward insulating portion 82 and the intermediate portion 52.

Figure 2:
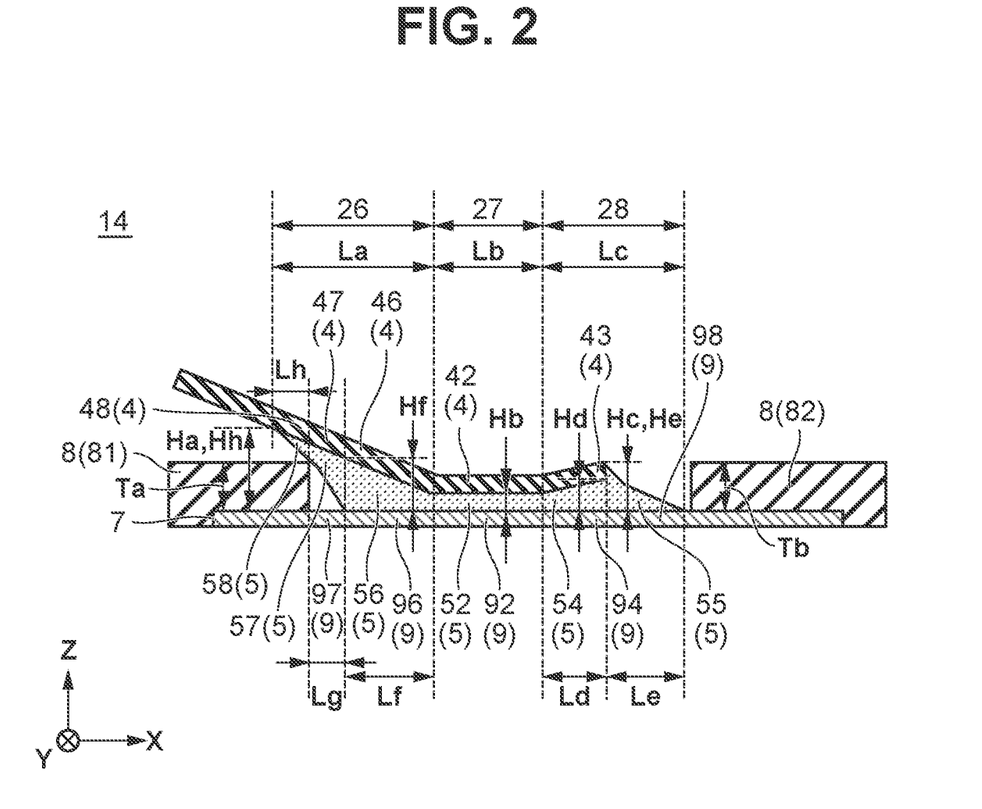
FIG. 2 is a schematic view illustrating an electronic module.

FIG. 2 illustrates the height of each portion of the solder member 5 from a reference surface. In the present exemplary embodiment, a flat surface including the joined surface between the pad electrode 9 and the solder member 5 is defined as the reference surface. The joined surface between the pad electrode 9 and the solder member 5 is formed of an alloy layer including a component metal of the pad electrode 9 and a component metal of the solder member 5. For ease of illustration, the illustration of some of the components is omitted in FIG. 2. The height of each portion of the solder member 5 from the reference surface is represented by the peak height of each portion of the solder member 5 from the reference surface.

In the present exemplary embodiment, a height Hc of the forward portion 53 from the reference surface is larger than a height Hb of the intermediate portion 52 from the reference surface (Hc>Hb). A height Ha of the backward portion 51 from the reference surface is larger than the height Hb of the intermediate portion 52 from the reference surface (Ha>Hb). The height Ha of the backward portion 51 from the reference surface is larger than the height Hc of the forward portion 53 from the reference surface (Ha>Hc). Accordingly, the height Hc of the forward portion 53 from the reference surface is larger than the height Hb of the intermediate portion 52 from the reference surface, and is smaller than the height Ha of the backward portion 51 from the reference surface (Hb<Hc<Ha).

In the example illustrated in FIG. 2, a height Hh of the third backward portion 58 is larger than a height Hf of the first backward portion 56 (Hh>Hf). Accordingly, the height Ha of the backward portion 51 is defined by the height Hh. The height Hh corresponds to the height of the one end 546 illustrated in FIG. 1A. In the example illustrated in FIG. 2, a height He of the second forward portion 55 is larger than a height Hd of the first forward portion 54 (Hd<He). Accordingly, the height Hc of the forward portion 53 is defined by the height He. The height He corresponds to the height of the other end 548 illustrated in FIG. 1A.

In the connection portion 10 between the connection electrode 4 of the wiring member 12 and the solder member 5, the region joined with the solder member 5 extends to the cover lay 3. The maximum heights Ha and Hh in the Z-direction of the connection portion 10 of the solder member 5 on the side of the cover lay 3 from the upper surface of the pad electrode 9 are larger than the height of the leading edge of the wiring member 12. The one end 546 of the solder member 5 on the side of the cover lay 3 in the connection portion 10 of the solder member 5 is formed on the outside of an end face of the opening of the insulating layer 8. This configuration increases the volume of the solder member 5 (backward portion 51) on the side of the cover lay 3 in the connection portion 10 between the connection electrode 4 and the solder member 5, and the fillet-like solder member 5 is formed. This makes it possible to improve the strength of the connection portion 10 of the solder member 5. In the example illustrated in FIGS. 1A and 1B, the joined surface between the connection electrode 4 and the solder member 5 is spaced apart from the end portion of the cover lay 3. However, the joined surface between the connection electrode 4 and the solder member 5 can be located in contact with an end face of the cover lay 3.

All electrodes on the wiring member 12 may desirably have the shape as described in the present exemplary embodiment. However, the electrodes on the wiring member 12 may desirably have this shape at least in the connection portion 10 in the vicinity of the both ends of the wiring member 12.

The forward region 43 of the wiring member 12 can be formed to warp upward from the intermediate region 42. Thus, the height Hc of the first forward portion 54 is larger than the height Hb of the intermediate portion 52. The upward warping of the wiring member 12 in the forward region 28 increases the volume of the forward portion 53 (first forward portion 54) of the solder member 5. The increase in the volume of the solder member 5 makes it possible to bear a high load. That is, the connection strength of the connection portion 10 of the solder member 5 can be improved.

The height Hd of the first forward portion 54 from the reference surface and the height He of the second forward portion 55 from the reference surface are larger than the height Hb of the intermediate portion 52 from the reference surface (Hd & He>Hb). The height Hf of the first backward portion 56 from the reference surface and the height Hh of the third backward portion 58 from the reference surface are larger than the height Hb of the intermediate portion 52 from the reference surface (Hf & Hh>Hb).

A length Le of the second forward portion 55 in the X-direction may preferably be larger than the height He of the second forward portion 55 (Le>He). A length Ld of the first forward portion 54 in the X-direction may preferably be larger than the height Hd of the first forward portion 54 in the X-direction (Ld>Hd).

The length Le of second forward portion 55 in the X-direction may preferably be larger than the length Ld of the first forward portion 54 in the X-direction (Le>Ld). In the forward region 28 of the connection portion 10, the length in the X-direction from the leading edge of the wiring member 12 to the leading edge of the solder member 5 on the connection electrode 4 is larger than the height from the upper surface of the pad electrode 9 in the Z-direction to the peak of the connection portion 10 between the connection electrode 4 and the solder member 5. This configuration makes it possible to distribute the load on the solder member 5 and improves the connection strength.

The height Hh of the backward portion 51 from the reference surface may be preferably larger than a thickness Ta of the backward insulating portion 81. The height of the forward portion 53 from the reference surface is smaller than a thickness Tb of the forward insulating portion 82.

This configuration improves the connection strength of the connection portion 10.

In the example illustrated in FIGS. 1A and 1B and FIG. 2, a void 800 is located between the backward portion 51 and the pad electrode 9 in the Z-direction. The end face of the cover lay 3 that covers the connection electrode 4 is located on the outside of the end face of the opening 80 in the insulating layer 8 of the circuit member 11. The solder member 5 may not be joined to a part of the connection electrode 4. However, the void 800 may not be located between the backward portion 51 and the pad electrode 9 in the Z-direction, like in modified examples illustrated in FIGS. 3A to 3C.

In the example illustrated in FIGS. 1A and 1B and FIG. 2, the second backward portion 57 that is continuous to the first backward portion 56 that is joined to each of the connection electrode 4 and the pad electrode 9 is joined to the connection electrode 4 and is spaced apart from the pad electrode 9. However, like in the modified example illustrated in FIG. 3A, the second backward portion 57 can be spaced apart from the connection electrode 4 and can be joined to the pad electrode 9.

Figure 3A:
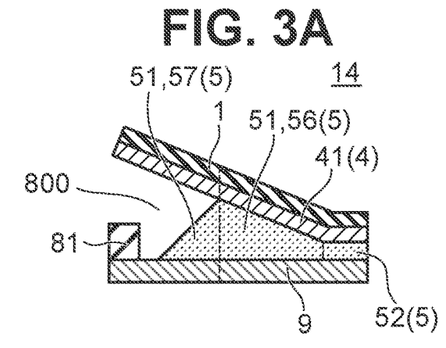
FIGS. 3A to 3G are schematic views each illustrating an electronic module.

In the example illustrated in FIGS. 1A and 1B and FIG. 2 and the modified example illustrated in FIG. 3A, the second backward portion 57 is spaced from one of the connection electrode 4 and the pad electrode 9, and is provided to the other of the connection electrode 4 and the pad electrode 9. However, like in the modified examples illustrated in FIGS. 3B and 3C, the third backward portion 58 and the first backward portion 56 that overlap the backward insulating portion 81 can be continuously formed without forming the second backward portion 57.

In the example illustrated in FIGS. 1A and 1B and FIG. 2 and the modified example illustrated in FIG. 3A, the backward portion 51 is spaced apart from the backward insulating portion 81. However, like in the modified examples illustrated in FIGS. 3B and 3C, the backward portion 51 can be in contact with the backward insulating portion 81.

Figure 3B:
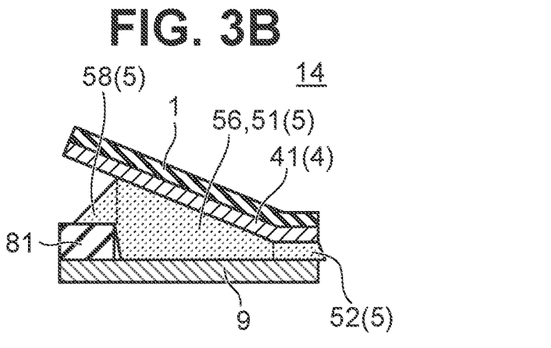
Figure 3C:
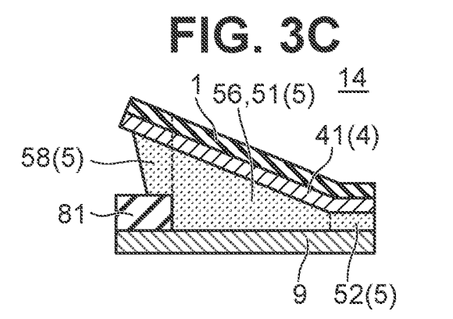

In the example illustrated in FIGS. 1A and 1B and FIG. 2 and the modified examples illustrated in FIGS. 3B and 3C, the backward insulating portion 81 is located between the conductive layer 7 and the backward portion 51 in the Z-direction. However, like in the modified example illustrated in FIG. 3A, the backward insulating portion 81 may not be located between the conductive layer 7 and the backward portion 51 in the Z-direction.

Figure 3D:
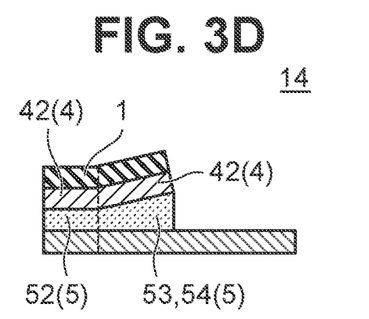
Figure 3E:
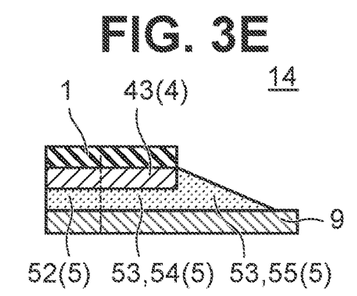
Figure 3F:
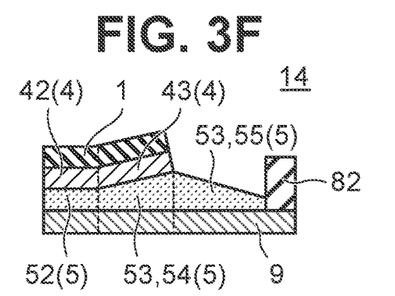

In the example illustrated in FIGS. 1A and 1B and FIG. 2 and modified examples illustrated in FIGS. 3E and 3F, the second forward portion 55 is provided. However, like in a modified example illustrated in FIG. 3D, the second forward portion 55 can be omitted if the height of the first forward portion 54 is larger than the height of the intermediate portion 52.

In the example illustrated in FIGS. 1A and 1B and FIG. 2 and the modified examples illustrated in FIGS. 3D and 3F, the height of the first forward portion 54 is larger than the height of the intermediate portion 52. However, like in the modified example illustrated in FIG. 3E, the height of the first forward portion 54 cannot be larger than the height of the intermediate portion 52 if the height of the second forward portion 55 is larger than the height of the intermediate portion 52.

In the example illustrated in FIGS. 1A and 1B and FIG. 2 and the modified example illustrated in FIG. 3E, the height of the second forward portion 55 is larger than the height of the first forward portion 54. However, like in the modified example illustrated in FIG. 3F, the height of the second forward portion 55 can be equal to the height of the first forward portion 54, or can be smaller than the height of the first forward portion 54.

In the example illustrated in FIGS. 1A and 1B and FIG. 2 and the modified examples illustrated in FIGS. 3D and 3E, the forward portion 53 is spaced apart from the forward insulating portion 82. However, like in the modified example illustrated in FIG. 3F, the forward portion 53 can be in contact with the forward insulating portion 82. The region connected with the solder member 5 extends to the leading edge of the connection electrode 4 of the wiring member 12. The connection area between the solder member 5 and the connection electrode 4 increases. This makes it possible to reduce peeling of the solder member 5 and the wiring member 12 and improves the connection strength.

Figure 3G:
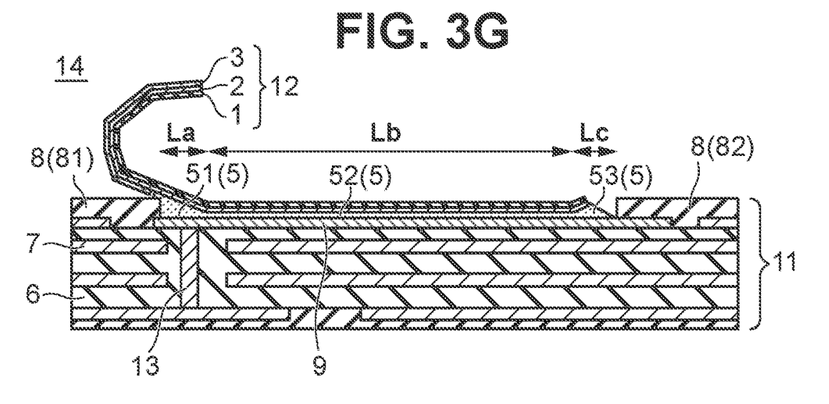

As illustrated in FIG. 3G, a length Lb of the intermediate portion 52 in the X-direction can be larger than a length La of the backward portion 51 in the X-direction. The length Lb of the intermediate portion 52 in the X-direction can be larger than a length Lc of the forward portion 53 in the X-direction. The length Lb of the intermediate portion 52 in the X-direction can be larger than the sum (La+Lc) of the length La of the backward portion 51 in the X-direction and the length Lc of the forward portion 53 in the X-direction (Lb>La+Lc).

As illustrated in FIG. 3G, the wiring member 12 can be bent to include a portion where the wiring layer 2 and the insulating base material 1 are located between the cover lay 3 and the circuit member 11. In the connection portion 10, the connection electrode 4 is located between the insulating base material 1 and the pad electrode 9. In the vicinity of the connection portion 10, the wiring layer 2 and the cover lay 3 are arranged between the insulating base material 1 and the circuit member 11. However, in a portion that is spaced apart from the connection portion 10 when the wiring member 12 is bent to be turned inside out, the wiring layer 2 and the insulating base material 1 are located between the cover lay 3 and the circuit member 11. Thus, even when the wiring member 12 is bent, a sufficient connection strength can be obtained at the connection portion 10 provided with the backward portion 51 and the forward portion 53. The load on the connection portion 10 between the wiring member 12 and the circuit member 11 can be reduced.

Also, in the configuration in which the wiring member 12 is turned back once, the end portion of the cover lay 3 that covers the connection electrode 4 is located on the outside of the opening 80 in the insulating layer 8. In other words, the end portion of the cover lay 3 is located above the backward insulating portion 81.

Figure 4A:
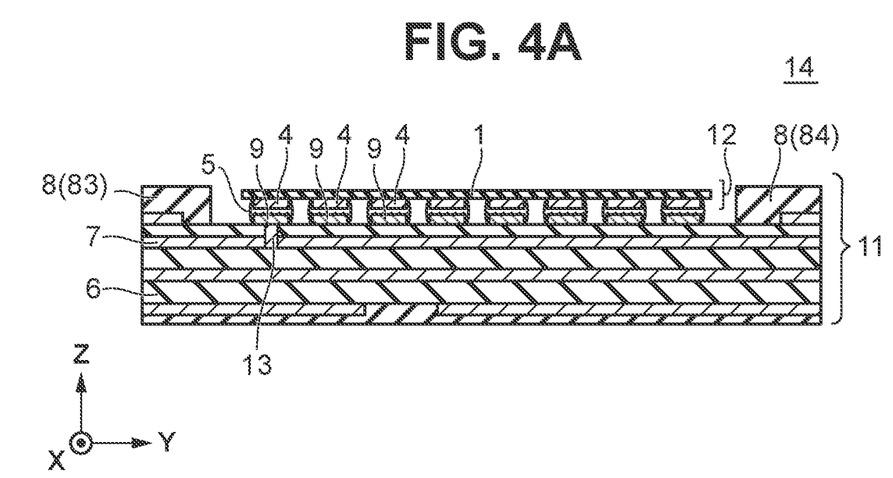
FIGS. 4A and 4B are schematic views each illustrating an electronic module.
Figure 4B:
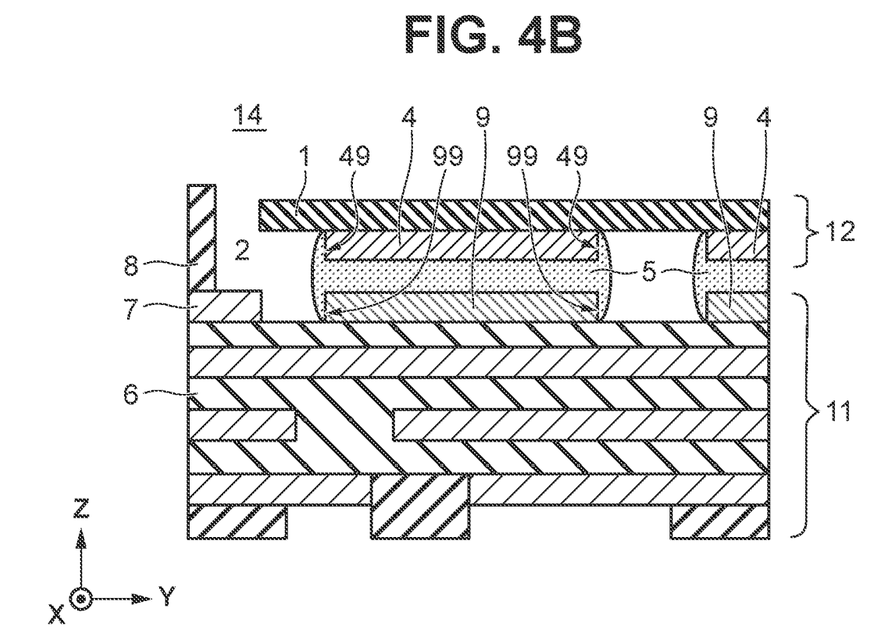

FIGS. 4A and 4B are sectional views taken along the Y-direction and including the connection portion 10. A plurality of pad electrodes 9 is arrayed along the Y-direction in the circuit member 11. The plurality of pad electrodes 9 is located between a side insulating portion 83 of the insulating layer 8 and a side insulating portion 84 of the insulating layer 8. A plurality of connection electrodes 4 is arrayed along the Y-direction in the wiring member 12. The plurality of solder members 5 is joined to any one of the plurality of pad electrodes 9 and any one of the plurality of connection electrodes 4. The plurality of solder members 5 is surrounded by the backward insulating portion 81, the forward insulating portion 82, and the side insulating portions 83 and 84. Each of the plurality of pad electrodes 9 includes not only an opposed surface facing the corresponding connection electrode 4, but also side surfaces 99 that face the adjacent pad electrodes 9. The opposed surface of each pad electrode 9 facing the corresponding connection electrode 4 extends along the X-direction and the Y-direction and crosses (is orthogonal to) the Z-direction. The side surfaces 99 extend along the Z-direction and the X-direction and cross (are orthogonal to) the Y-direction. The side surfaces 99 of each pad electrode 9 face the side surfaces 99 of the adjacent pad electrodes 9. Each of the plurality of connection electrodes 4 includes not only an opposed surface facing the corresponding pad electrode 9, but also side surfaces 49 that face the adjacent connection electrodes 4.

The opposed surface of each connection electrode 4 facing the corresponding pad electrode 9 extends along the X-direction and the Y-direction and crosses (is orthogonal to) the Z-direction. The side surfaces 49 extend along the Z-direction and the X-direction and cross (are orthogonal to) the Y-direction. The side surfaces 49 of each connection electrode 4 face the side surfaces 49 of the adjacent connection electrodes 4. The solder member 5 is joined to each of the side surfaces 99 of each pad electrode 9 and the side surfaces 49 of each connection electrode 4. The solder member 5 covers the region ranging from the side surfaces of each connection electrode 4 and the side surfaces of each pad electrode 9. This configuration makes it possible to increase the connection area of the solder member 5 and improves the connection strength of the connection portion 10.

The electronic module 14 will now be described in detail.

The circuit member 11 includes the insulating substrate 6, the conductive layer 7, and the insulating layer 8. The circuit member 11 is formed by stacking a plurality of conductive layers 7 through the insulating substrate 6. Unlike the wiring member 12, the circuit member 11 is a rigid wiring substrate.

For example, the circuit member 11 can be formed of a glass epoxy material or a ceramic substrate. For example, the circuit member 11 of a land grid array (LGA) type or a ceramic leadless chip carrier (CLCC) type can also be used.

While the present exemplary embodiment illustrates an example where four conductive layers 7 are formed in the circuit member 11, the number of conductive layers 7 is not limited to four. One or more conductive layers 7 can be formed in the circuit member 11. Specifically, four or less conductive layers 7 or four or more conductive layers 7 can be formed.

The insulating substrate 6 is an insulating base material on a substrate formed of, for example, a hard composite material. Unlike the insulating base material 1, the insulating substrate 6 is hard. An insulating material forming the insulating substrate 6 can have electrical insulating properties. The insulating substrate 6 can be, for example, a resin substrate obtained by curing resin such as epoxy resin, or a ceramic substrate formed using ceramics.

Each conductive layer 7 is a conductive layer formed of metal foil such as copper foil. Each conductive layer 7 includes a wiring pattern. The conductive layers 7 are formed on one or both of the surfaces of the insulating substrate 6. One or more conductive layers 7 are also formed in the insulating substrate 6. FIGS. 3A to 3G and FIGS. 4A and 4B each illustrate an example where four conductive layers 7, including two conductive layers 7 on both surfaces of the insulating substrate 6 and two conductive layers 7 in the insulating substrate 6, are formed. A via-hole 13 that electrically connects the conductive layers 7 is formed in the insulating substrate 6. Some of the pad electrodes 9 can be directly connected to the via-hole 13. In the solder member 5 that connects each connection electrode 4 and each pad electrode 9, the conductor of each of the conductive layer 7 and the via-hole 13 is made of a material having higher conductivity and thermal conductivity than those of the insulating material. The material is, for example, metal such as copper or gold.

The insulating layer 8 is an insulating protective film that protects each circuit formed of the conductive layer 7. The insulating layer 8 is formed using hardened liquid resist, film-like solder resist, or the like.

The insulating layer 8 can be referred to as a solder resist layer. The insulating layer 8 is formed to cover the conductive layers 7 on one of the surfaces to which the wiring member 12 of the circuit member 11 is connected. The insulating layer 8 is also formed to cover the conductive layers 7 on the other surface where an image capturing device 15 of the circuit member 11 is mounted.

The insulating layer 8 is provided with an opening through which each conductive layer 7 is exposed. The exposed portion of each conductive layer 7 forms the corresponding pad electrode 9. The pad electrodes 9 are arranged on, for example, a central portion of the circuit member 11. The upper surface of each pad electrode 9 is electrically connected to an electrode in the wiring member 12 via the solder member 5.

In the case of connecting each connection electrode 4 and each pad electrode 9 with the solder member 5, the connection electrode 4 and the pad electrode 9 can be bonded and connected to the solder member 5 in a state where the solder member 5 is heated to a melting point or higher. The solder member 5 can be, for example, paste supplied with Sn-3.0% Ag-0.5% Cu solder, Sn-58Bi solder, or the like, together with flux.

The wiring member 12 includes the insulating base material 1, the wiring layer 2, and the cover lay 3. The wiring member 12 has a configuration in which one or more conductive layers are formed as the wiring layer 2, and the conductor layers are stacked as the insulating layer 8 through the insulating base material 1. While the present exemplary embodiment illustrates an example where a single conductive layer 7 is formed in the wiring member 12, the number of conductive layers 7 is not limited to one. Two or more conductive layers 7 can be formed.

Although not illustrated, one or more conductive shielding layers, one or more protective films, one or more reinforcing films, or the like can be formed on one or both of the insulating base material 1 of the wiring member 12 and the cover lay 3. These layers can cover the entire surface of the wiring member 12, or can cover a part of the wiring member 12.

The insulating base material 1 is a sheet-like or film-like insulating base material made of resin or the like, and has plasticity and flexibility. Accordingly, the wiring member 12 is deformable. For example, the wiring member 12 is bendable. The insulating material forming the insulating base material 1 can have electrical insulating properties. Examples of the insulating material forming the insulating base material 1 include polyimide and polyethylene terephthalate.

The wiring layer 2 is a conductive layer formed of metal foil such as copper foil. The wiring layer 2 includes a wiring pattern. The wiring layer 2 is formed on one or both of the surfaces of the insulating base material 1. The conductor forming the wiring layer 2 is a material having higher conductivity and thermal conductivity than those of the insulating materials. The conductor is metal such as copper, silver, or gold. The wiring layer 2 can be formed on at least one surface of the insulating base material 1.

The cover lay 3 is an insulating layer that protects each circuit formed of the wiring layer 2. The cover lay 3 is formed using a cover film or an overcoat. The cover lay 3 is formed to cover the wiring layer 2 on the surface where the wiring layer 2 of the insulating base material 1 is formed.

At one of the leading edges of the wiring member 12, the cover layer 3 is not formed and the wiring layer 2 is exposed. Each connection electrode 4 is formed at an exposed portion 24 of the wiring layer 2. The surface of each connection electrode 4 can be plated with gold or tin. The plurality of connection electrodes 4 is arranged at a predetermined pitch. All the connection electrodes 4 can be arranged at the same pitch, or can be arranged at different pitches. Thus, the connection electrodes 4 are each formed of the wiring layer 2 exposed at the leading edge of the wiring member 12. One of the leading edges of the wiring member 12 at which the connection electrode 4 is formed is configured as an insertion terminal.

Although not illustrated, the other one of the leading edges of the wiring member 12 can also be configured as the insertion terminal at which the connection electrode 4 is formed. Alternatively, an electrode on which a connector component having a surface mounting configuration is mounted can be exposed to the upper surface of the cover lay 3.

Although not illustrated, the wiring member 12 can be provided with a foil-like or mesh-like shielding layer formed of silver or the like. Further, a protective layer for protecting the shielding layer can be formed on the shielding layer.

One of the connection electrodes 4 in the wiring member 12 in which the connection electrodes 4 are formed is connected to the corresponding pad electrode 9 in the circuit member 11 via the solder member 5. The other of the connection electrodes 4 in the wiring member 12 is connected to a connector mounted on a circuit member of a circuit unit (not illustrated) via a connector component mounted on the wiring member 12. Alternatively, the other of the connection electrodes 4 in the wiring member 12 is inserted into the connector mounted on the circuit member of the circuit unit (not illustrated). More alternatively, the other of the connection electrodes 4 in the wiring member 12 is joined to the circuit member of the circuit unit (not illustrated) with solder. Thus, the wiring member 12 electrically connects the circuit member 11 and the circuit unit to each other.

Figure 5A:
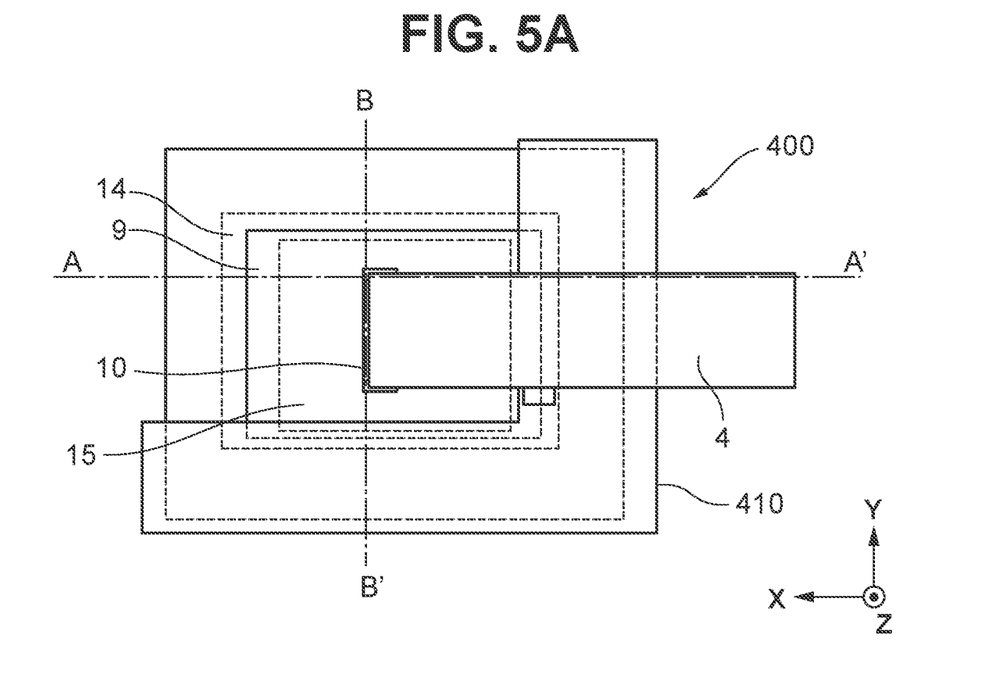
FIGS. 5A and 5B are schematic views each illustrating an image capturing unit.
Figure 5B:
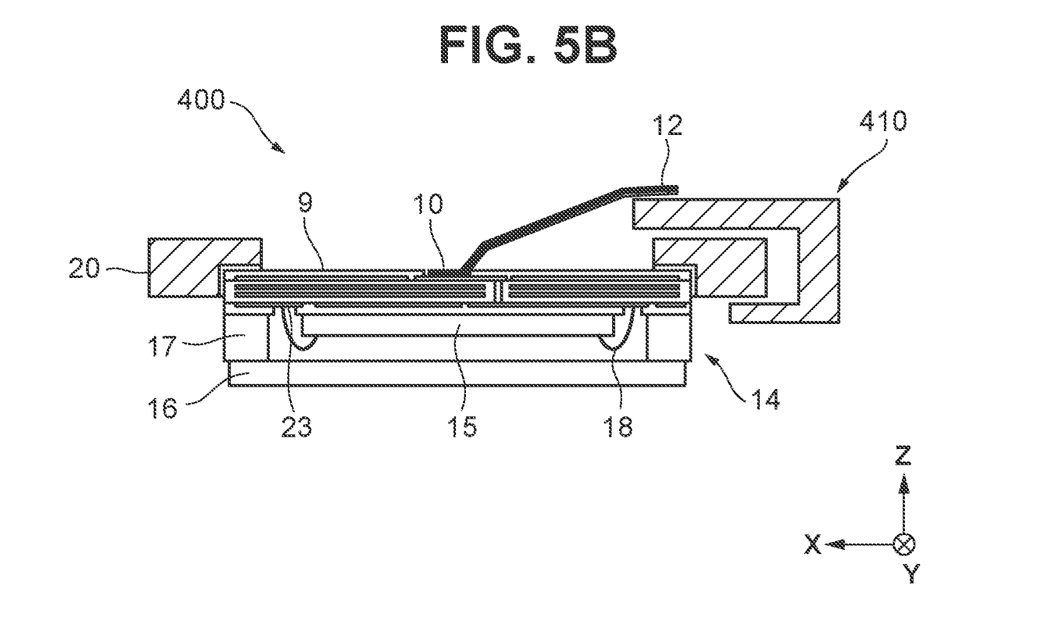

A configuration in which the electronic module 14 according to the present exemplary embodiment is used as an image capturing module and is applied to an image capturing unit 400 will now be described with reference to FIGS. 5A and 5B and FIGS. 6A and 6B. FIG. 5A is a top schematic view illustrating a schematic configuration of the image capturing unit 400. FIG. 5B is a schematic view illustrating a schematic configuration of the image capturing unit 400 according to the present exemplary embodiment, and illustrates a sectional view taken along a line B-B' in FIG. 5A.

The image capturing unit 400 includes the circuit member 11 on which the image capturing device 15 is mounted, and the wiring member 12 connected to the circuit member 11. The image capturing unit 400 further includes a driving device 410 that drives the circuit member 11 to move. The driving device 410 provides an image stabilizer function, such as a camera-shake correction function. The electronic module 14 serving as the image capturing module includes the circuit member 11, the image capturing device 15, a frame body 17, and a lid body 16. The circuit member 11 is bonded to the frame body 17 with an adhesive, such as ultraviolet (UV)-curing resin, and is fixed to the frame body 17. The electronic module 14 is held on the driving device 410 in such a manner that the electronic module 14 can move relative to the driving device 410 as described below.

A configuration can also be employed in which the image capturing device 15 is mounted on a ceramic substrate and the ceramic substrate and the circuit member 11 are connected with a pair of electrodes via the solder member 5. In this case, it can also be said that the image capturing device 15 is mounted on the circuit member 11.

The image capturing device 15 is a solid-state image sensor, such as a complementary metal oxide semiconductor (CMOS) image sensor or a charge-coupled device (CCD) image sensor. The image capturing device 15 is mounted on the circuit member 11 such that the image capturing device 15 is not in contact with the lid body 16 in a hollow portion surrounded by the circuit member 11, the lid body 16 serving as a cover glass, and the frame body 17. The frame body 17 can be made of metal or resin. The image capturing device 15 is electrically connected with a wire pad 23 of the circuit member 11 via a metal wire 18. The wire pad 23 is plated with, for example, gold. While the present exemplary embodiment illustrates an example where the frame body 17 is mounted, the location where the frame body 17 is disposed is not limited to an upper portion in the vicinity of the circuit member 11. A substrate can also be buried in the frame body 17 on a cavity. The image capturing device 15 can also be disposed in a structure with a counterbore, such as a cavity substrate, in which a hollow portion of the circuit member 11 is not formed.

Although not illustrated, electronic components used for operation of the image capturing device 15 are mounted on the circuit member 11. Although not illustrated, only the both ends in the width direction on the insulating base material 1, or the front surface in the width direction can be covered with UV-curing resin, thermosetting resin, or a film-like reinforcing member. With this configuration, the structure of the connection portion 10 of the solder member 5 and the reinforcing member 21 improve the connection strength. While FIGS. 5A and 5B illustrate an example where the wiring member 12 is mounted in parallel to the short sides of the circuit member 11, the wiring member 12 can also be mounted in parallel to the long sides of the circuit member 11. While FIGS. 5A and 5B illustrate an example where only one wiring member 12 is connected to the circuit member 11, two or more wiring members 12 can also be connected. If a plurality of wiring members 12 is mounted, the wiring members 12 can be drawn out in the same direction or in different directions.

The driving device 410 supports the frame body 17 such that the electronic module 14 fixed to the frame body 17 can be moved in the X-direction and the Y-direction and can be rotated in a θ-direction in the X-Y plane. The driving device 410 moves or rotates the electronic module 14 depending on a camera shake, thereby making it possible to correct the camera shake.

The circuit unit connected to the wiring member 12 can be an information processing unit that processes information based on a signal obtained by the image capturing device 15. Examples of the information based on the signal obtained by the image capturing device 15 include an image, an image feature amount, and distance information.

The image capturing unit 400 according to the present exemplary embodiment has the configuration as described above.

Figure 7:
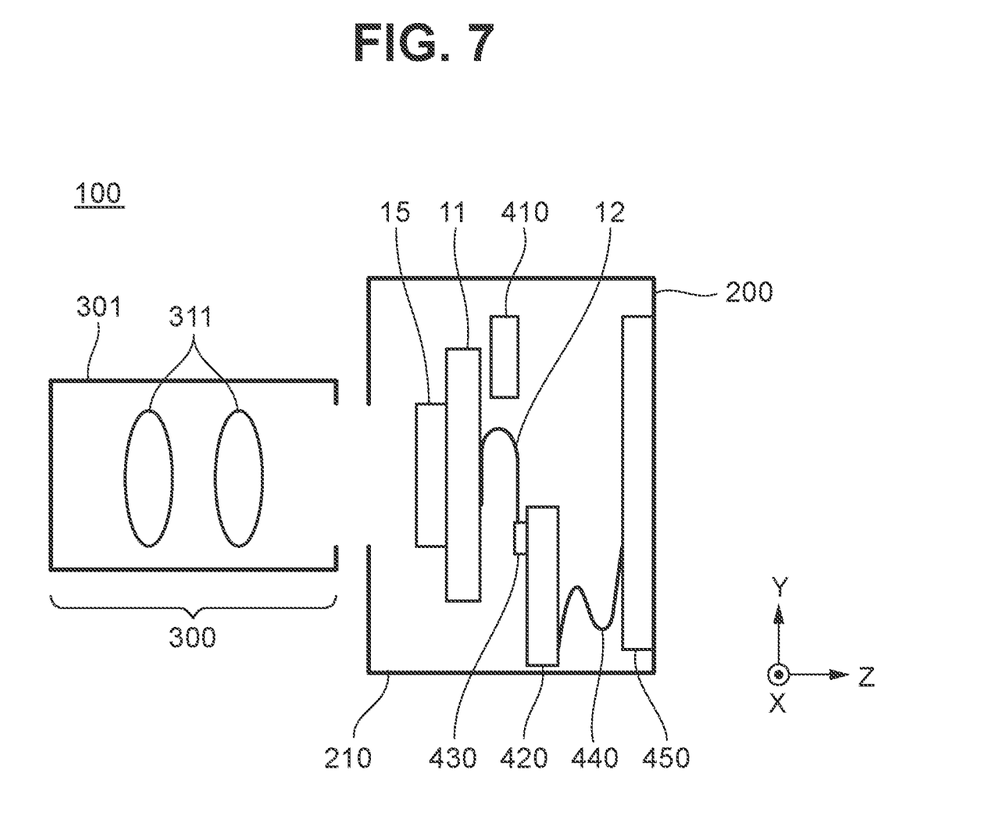
FIG. 7 is a schematic view illustrating an electronic apparatus.

An electronic apparatus including the electronic module 14 will now be described with reference to FIG. 7. FIG. 7 is a schematic view illustrating a schematic configuration of a camera as an example of the electronic apparatus according to the present exemplary embodiment.

A digital camera 100 that is an image capturing apparatus used as an example of the electronic apparatus according to the present exemplary embodiment is, for example, a lens-interchangeable mirrorless camera. The digital camera 100 includes a camera body 200 and an interchangeable lens 300 that is detachably mounted on the camera body 200. The interchangeable lens 300 includes a lens barrel 301 and a plurality of lenses 311 accommodated in the lens barrel 301. The circuit member 11 on which the image capturing device 15 is mounted and the wiring member 12 joined to the circuit member 11 with solder are stored in a casing 210 of the camera body 200. The wiring member 12 is connected to a connector 430 of a circuit unit 420. The driving device 410 is provided in the casing 210, and the driving device 410 causes the circuit unit 420 to move the circuit member 11 relative to the circuit unit 420. A force applied when the circuit member 11 moves relative to the circuit unit 420 is added to the connection portion 10. However, the connection portion 10 according to the present exemplary embodiment has a high strength, and thereby the reliability can be ensured. The circuit unit 420 processes the information based on the signal obtained by the image capturing device 15. The wiring member 12 can be configured to establish high-speed and large-capacity communication so that a large amount of information can be transferred from the image capturing device 15. An image generated by the circuit unit 420 is displayed on a display device 450 via a wiring member 440.

The image capturing device 15 in the electronic module 14 is a solid-state image sensor, such as a CMOS image sensor or a CCD image sensor, that photoelectrically converts an optical image formed by an image capturing optical system. As described above, the digital camera 100 is configured as the image capturing apparatus including the image capturing unit 400.

As described above, according to the present exemplary embodiment, the load occurring at the connection portion 10 between the wiring member 12 and the circuit member 11 even in a case of, for example, a drop impact or carrying of the mirrorless camera, can be reduced, which leads to an improvement in performance of the camera. While the present exemplary embodiment described above illustrates an example where the interchangeable lens 300 is mounted on the camera body 200 to capture images, the present disclosure is not limited to this example. The camera body 200 on which the interchangeable lens 300 is not mounted can also be used for the electronic apparatus.

While the present exemplary embodiment described above illustrates an example where the camera is divided into the camera body 200 and the interchangeable lens 300, an integrated camera in which lenses are incorporated in the camera body 200 can also be used.

While the present exemplary embodiment described above illustrates an example where a camera is used as the image capturing apparatus as an example of the electronic apparatus, the present disclosure is not limited to this example.

Example 1

The image capturing unit 400 including the connection portion 10 having the configuration illustrated in FIG. 3G in the layout configuration of the image capturing unit 400 illustrated in FIGS. 5A and 5B was produced as the image capturing unit 400 according to Example 1.

In the image capturing unit 400 according to Example 1, the frame body 17 made of resin and having a thickness of 2 mm was used. As the image capturing device 15, an image sensor having a flat rectangular surface of 30 mm×20 mm was used. As the lid body 16, a glass plate (cover glass) having a planar rectangular shape of 28 mm×38 mm was used.

The wiring member 12 having a configuration in which the insulating base material 1 and the cover lay 3 are made of a polyimide material and the wiring layer 2 and each connection electrode 4 are made of a Cu material was used. The thickness of each of the flexible wiring base material and the cover lay 3 was 12.5 μm, and the thickness of the wiring layer 2 was 12 μm.

The circuit member 11 having a configuration in which the insulating substrate 6 is made of a glass epoxy material and the conductive layer 7 and each pad electrode 9 are made of a Cu material was used. The thickness of each of the conductive layer 7 and the pad electrode 9 was about 30 μm.

The insulating layer 8 that is formed of film resist and has a thickness of 20 µm (Ta=Tb=20 µm) was used.

As the adhesive used to fix the circuit member 11 to the metallic frame body 17, UV-curing resin was used. The metallic frame body 17 having an outer shape of 50 mm×60 mm was used.

The connection electrodes 4 in the wiring member 12 and the pad electrodes 9 in the circuit member 11 were connected with the solder member 5. The pad electrodes 9 were arranged at a pitch of 0.2 mm. The width of each pad electrode 9 was 0.15 mm, and 80 wires were used. The size of the opening in the insulating layer 8 through which the pad electrodes 9 are exposed was 1.1 mm×20 mm. The connection electrodes 4 were arranged at a pitch of 0.2 mm. The width of each connection electrode 4 was 0.15 mm, and 80 wires were used. The size of the opening in the cover lay 3 through which the pad electrodes 9 are exposed was 1.2 mm from the leading edge. The width of the wiring member 12 was 22 mm, which was larger than the opening width of 20 mm in the insulating layer 8. The pitch between the electrodes, the width of each electrode, and the number of electrodes were appropriately set depending on the specifications of the electronic module 14.

The solder member 5 made of Sn-3.0% Ag-0.5% Cu solder was used. The driving device 410 having an L-shape in which a rectangle of 70 mm×55 mm was cut from a rectangle of 85 mm×70 mm was used.

The connection portion 10 of the solder member 5 was formed with a structure in which the leading edge and the trailing edge of the wiring member 12 warp upward. The intermediate region 42 connecting the forward region 43 and the backward region 41 of the wiring member 12 was parallel to the upper surface of the pad electrode 9.

The wiring member 12 was formed to warp upward in a range from the position that is spaced apart by 0.1 mm in the backward direction from the leading edge of the wiring member 12 to the leading edge of the wiring member 12 (Ld=0.1 mm). The leading edge of the wiring member 12 warps upward only by 2 µm from the intermediate region 42. The height of the connection portion 10 of the solder member 5 from the corresponding pad electrode 9 below the leading edge of the wiring member 12 was 5 µm (Hd=5 µm). The solder member 5 was joined to the end face of each connection electrode 4, and the peak height of the forward portion 53 of the solder member 5 was 17 µm (He=Hc=17 µm). The length of the second forward portion 55 of the solder member 5 was 0.08 mm (Le=0.08 mm). The height of the solder member 5 at the position that is spaced apart by 0.1 mm in the backward direction from the leading edge of the wiring member 12 was 3 µm. The height of the solder member 5 from the upper surface of the pad electrode 9 in the intermediate region 27 of the connection portion 10 of the solder member 5 was 3 µm (Hb=3 µm). The length of the intermediate region 27 of the connection portion 10 of the solder member 5 was 0.6 mm (Lb=0.6 mm). The backward region 41 of the wiring member 12 was located on the backward side of the position that is spaced apart by 0.7 mm from the leading edge of the wiring member 12 (Lb+Ld=0.7 mm). The wiring member 12 warps in the +Z-direction from this position. The distance from this position to the backward insulating portion 81 of the insulating layer 8 was 0.2 mm (Lf=0.2 mm). In the configuration illustrated in FIG. 3G, the first backward portion 56 illustrated in FIG. 1A is in contact with the backward insulating portion 81. Accordingly, the second backward portion 57 illustrated in FIG. 1A is not present, and thus the third backward portion 58 and the first backward portion 56 are continuously formed. The second backward region 97 and the second backward region 47 are also not present (Lg=0 mm). The height of the solder member 5 in the +Z-direction from the pad electrode 9 located immediately above the end portion on the side of the opening 80 of the backward insulating portion 81 of the insulating layer 8 was 35 µm (Hf=35 µm). The solder member 5 was connected to the connection electrode 4 in a range from the end portion on the side of the opening 80 of the backward insulating portion 81 of the insulating layer 8 to the position that is spaced apart by 0.1 mm in the −X-direction (Lh=0.1 mm). The height of the connection portion 10 between the connection electrode 4 and the solder member 5 from the upper surface of the pad electrode 9 at this position was 40 µm (Ha=Hh=40 µm). In the image capturing apparatus incorporating the completed image capturing unit 400 according to Example 1, the satisfactory optical performance of the CMOS image sensor incorporated in the image capturing apparatus was ensured.

Example 2

Figure 6A:
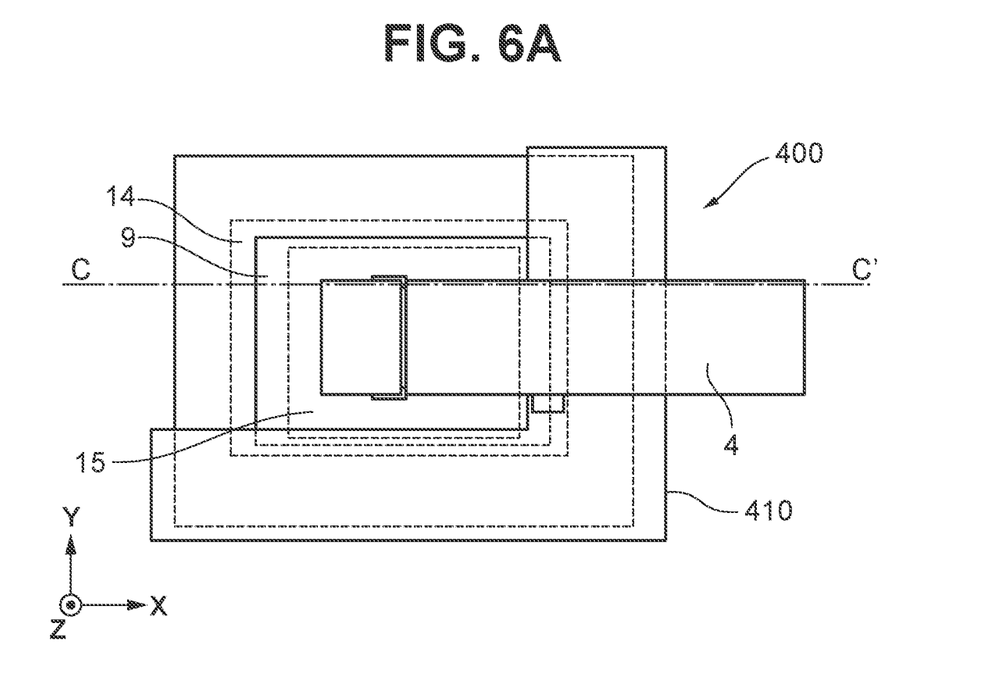
FIGS. 6A and 6B are schematic views each illustrating an image capturing unit.
Figure 6B:
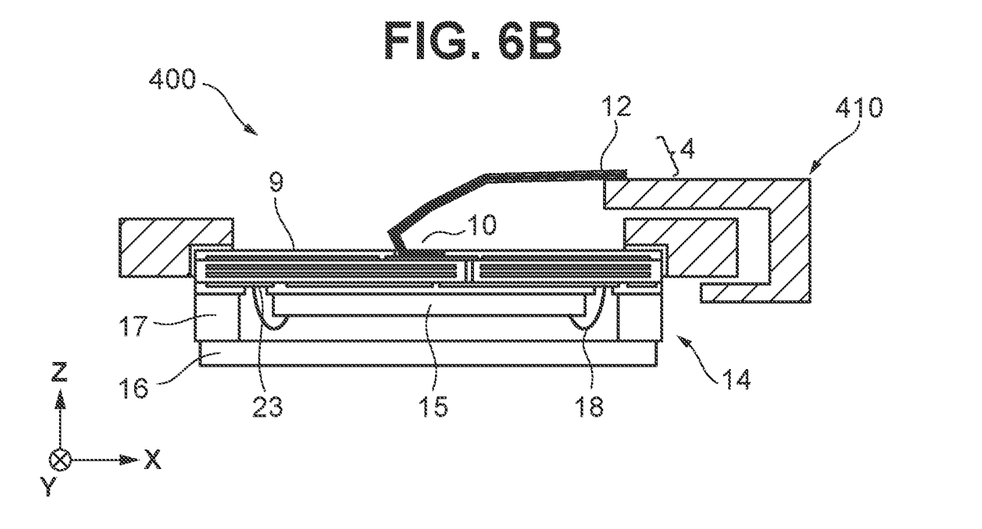

The image capturing unit 400 according to Example 2 differs from the image capturing unit 400 according to Example 1 in that the layout configuration of the image capturing unit 400 illustrated in FIGS. 6A and 6B was employed. In addition, the image capturing unit 400 according to Example 2 differs from the image capturing unit 400 according to Example 1 in that the wiring member 12 was drawn out on the opposite side of the driving device 410 as illustrated in FIGS. 6A and 6B and was turned back once. The other features of the image capturing unit 400 according to Example 2 may be the same as those of the image capturing unit 400 according to Example 1.

In the image capturing apparatus incorporating the completed image capturing unit 400 according to Example 2, the satisfactory optical performance of the CMOS image sensor incorporated in the image capturing apparatus was ensured. According to Example 2, the load occurring at the connection portion 10 between the wiring member 12 and the circuit member 11 can be reduced even in a bent state. Although not illustrated, formation of a hemisphere or semi-elliptic UV-curing resin having a diameter of 3 mm and a height of about 1 mm at both ends of the wiring member 12 can further reduce the load occurring at the connection portion 10 of the solder member 5.

According to the exemplary embodiments described above, it is possible to provide a technique advantageous in improving a connection strength between a rigid printed wiring member and a flexible printed wiring member.

The above-described exemplary embodiments can be modified, as needed, without departing from the technical idea of the disclosure. For example, a plurality of exemplary embodiments can be combined. Further, features in at least some of exemplary embodiments can be deleted or replaced. A new feature can also be added to at least one of the exemplary embodiments.

The disclosed content in the present specification includes not only features expressly described in the present specification, but also all of the features which are understandable from the present specification and the drawings attached to the present specification. The disclosed content of the present specification also includes complementary sets of concepts described in the present specification. Specifically, if there is a description in the present specification to the effect that "A is B", for example, it is assumed that the present specification discloses or suggests that "A is not B", even if a description to the effect that "A is not B" is omitted. This is because it is a premise that a description to the effect that "A is B" takes into consideration the case where "A is not B".

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2022-056601, filed Mar. 30, 2022, which is hereby incorporated by reference herein in its entirety.

What is claimed is:

1. An electronic module comprising:
a rigid printed circuit member including a first electrode;
a flexible printed wiring member including a second electrode; and
a solder member joined to each of the first electrode and the second electrode,
wherein, in a case where a direction perpendicular to a joined surface between the first electrode and the solder member is a first direction and a direction parallel to the joined surface between the first electrode and the solder member is a second direction, the solder member includes:
a first portion located between the rigid printed circuit member and a first region of the second electrode in the first direction, wherein the first portion includes one end of a joined surface between the second electrode and the solder member,
a second portion located between a first region of the first electrode and a second region of the second electrode in the first direction, and
a third portion located on a second region of the first electrode in the first direction, wherein the third portion includes one end of the joined surface between the first electrode and the solder member,
wherein, in the first direction, the second region of the first electrode partially overlaps a leading edge of the second electrode,
wherein, in the second direction, the second portion is located between the first portion and the third portion and is continuous to each of the first portion and the third portion, and
wherein a height of the third portion from a reference surface including the joined surface between the first electrode and the solder member is larger than a height of the second portion from the reference surface and is smaller than a height of the first portion from the reference surface,
wherein the rigid printed circuit member includes a conductive layer including the first electrode and an insulating layer covering the conductive layer, and at least a part of the solder member is located between a first insulating portion of the insulating layer and a second insulating portion of the insulating layer.

2. The electronic module according to claim 1,
wherein, in the second direction, the first portion is located between the first insulating portion and the second portion, and
wherein, in the second direction, the third portion is located between the second insulating portion and the second portion.

3. The electronic module according to claim 2, wherein the height of the first portion from the reference surface is larger than a thickness of the first insulating portion.

4. The electronic module according to claim 2, wherein the third portion is in contact with the second insulating portion.

5. The electronic module according to claim 2, wherein the height of the second portion from the reference surface is smaller than a thickness of the second insulating portion.

6. The electronic module according to claim 2, wherein the first portion is in contact with the first insulating portion.

7. The electronic module according to claim 2, wherein, in the first direction, the first insulating portion is located between the conductive layer and the first portion.

8. The electronic module according to claim 1, wherein, in the first direction, a void is located between the first portion and the first electrode.

9. The electronic module according to claim 1, wherein the third portion further includes a fourth portion overlapping the second electrode in the first direction, and a height of the fourth portion from the reference surface is larger than the height of the second portion from the reference surface.

10. The electronic module according to claim 1, wherein the third portion further includes a fourth portion and a fifth portion, and the fourth portion overlaps the second electrode in the first direction and the fifth portion does not overlap the second electrode in the first direction.

11. The electronic module according to claim 1, wherein the solder member is joined to a side surface of the first electrode along the first direction and is joined to a side surface of the second electrode along the first direction.

12. An apparatus comprising:
the electronic module according to claim 1; and
a circuit unit connected to the rigid printed circuit member via the flexible printed wiring member.

13. The apparatus according to claim 12, further comprising a driving device configured to move the rigid printed circuit member relative to the circuit unit.

14. The apparatus according to claim 12, wherein an image capturing device is mounted on the rigid printed circuit member.

15. The apparatus according to claim 14, wherein the circuit unit is configured to process information based on a signal obtained by the image capturing device.

16. An electronic module comprising:
a rigid printed circuit member including a first electrode;
a flexible printed wiring member including a second electrode; and
a solder member joined to each of the first electrode and the second electrode,
wherein, in a case where a direction perpendicular to a joined surface between the first electrode and the solder member is a first direction and a direction parallel to the joined surface between the first electrode and the solder member is a second direction, the solder member includes:
a first portion located between the rigid printed circuit member and a first region of the second electrode in the first direction, wherein the first portion includes one end of a joined surface between the second electrode and the solder member,
a second portion located between a first region of the first electrode and a second region of the second electrode in the first direction, and
a third portion located on a second region of the first electrode in the first direction, wherein the third portion includes one end of the joined surface between the first electrode and the solder member, wherein, in the first direction, the second region of the first electrode partially overlaps a leading edge of the second electrode, wherein, in the second direction, the second portion is located between the first portion and the third portion and is continuous to each of the first portion and the third portion, and wherein a height of the third portion from a reference surface including the joined surface between the first electrode and the solder member is larger than a height of the second portion from the reference surface and is smaller than a height of the first portion from the reference surface, wherein the electronic module satisfies at least one of conditions (i), (ii) and (iii) comprising: (i) a height of the fifth portion from the reference surface is larger than a height of the fourth portion from the reference surface;

(ii) a length of the fifth portion in the second direction is larger than a height of the fifth portion from the reference surface; and (iii) a height of the fourth portion from the reference surface is larger than the height of the second portion from the reference surface.

17. An apparatus comprising:
the electronic module according to claim 16; and
a circuit unit connected to the rigid printed circuit member via the flexible printed wiring member.

18. The apparatus according to claim 17, further comprising a driving device configured to move the rigid printed circuit member relative to the circuit unit.

19. The apparatus according to claim 17, wherein an image capturing device is mounted on the rigid printed circuit member.

20. An electronic module comprising:
a rigid printed circuit member including a first electrode;
a flexible printed wiring member including a second electrode; and
a solder member joined to each of the first electrode and the second electrode,
wherein, in a case where a direction perpendicular to a joined surface between the first electrode and the solder member is a first direction and a direction parallel to the joined surface between the first electrode and the solder member is a second direction, the solder member includes:
  a first portion located between the rigid printed circuit member and a first region of the second electrode in the first direction, wherein the first portion includes one end of a joined surface between the second electrode and the solder member,
  a second portion located between a first region of the first electrode and a second region of the second electrode in the first direction, and
  a third portion located on a second region of the first electrode in the first direction, wherein the third portion includes one end of the joined surface between the first electrode and the solder member,
wherein, in the first direction, the second region of the first electrode partially overlaps a leading edge of the second electrode,
wherein, in the second direction, the second portion is located between the first portion and the third portion and is continuous to each of the first portion and the third portion, and
wherein a height of the third portion from a reference surface including the joined surface between the first electrode and the solder member is larger than a height of the second portion from the reference surface and is smaller than a height of the first portion from the reference surface,
wherein the flexible printed wiring member includes a wiring layer including the second electrode, an insulating base material configured to support the wiring layer, and a cover lay covering the wiring layer, and
wherein the wiring layer is located between the insulating base material and the cover lay, and the first electrode is located between the insulating base material and the second electrode.

21. The electronic module according to claim 20, wherein the flexible printed wiring member is bent to include a portion where the wiring layer and the insulating base material are located between the cover lay and the rigid printed circuit member.

22. An apparatus comprising:
the electronic module according to claim 20; and
a circuit unit connected to the rigid printed circuit member via the flexible printed wiring member.

23. The apparatus according to claim 22, further comprising a driving device configured to move the rigid printed circuit member relative to the circuit unit.

24. The apparatus according to claim 22, wherein an image capturing device is mounted on the rigid printed circuit member.

25. An apparatus comprising:
a rigid printed circuit member including a first electrode;
a flexible printed wiring member including a second electrode; and
a solder member joined to each of the first electrode and the second electrode; and
a circuit unit connected to the rigid printed circuit member via the flexible printed wiring member,
wherein an image capturing device is mounted on the rigid printed circuit member,
wherein, in a case where a direction perpendicular to a joined surface between the first electrode and the solder member is a first direction and a direction parallel to the joined surface between the first electrode and the solder member is a second direction, the solder member includes:
a first portion located between the rigid printed circuit member and a first region of the second electrode in the first direction, wherein the first portion includes one end of a joined surface between the second electrode and the solder member,
a second portion located between a first region of the first electrode and a second region of the second electrode in the first direction, and
a third portion located on a second region of the first electrode in the first direction, wherein the third portion includes one end of the joined surface between the first electrode and the solder member,
wherein, in the first direction, the second region of the first electrode partially overlaps a leading edge of the second electrode,
wherein, in the second direction, the second portion is located between the first portion and the third portion and is continuous to each of the first portion and the third portion, and
wherein a height of the third portion from a reference surface including the joined surface between the first electrode and the solder member is larger than a height of the second portion from the reference surface and is smaller than a height of the first portion from the reference surface.

26. The apparatus according to claim 25, wherein the circuit unit is configured to process information based on a signal obtained by the image capturing device.

27. The apparatus according to claim 25, wherein the rigid printed circuit member includes a conductive layer including the first electrode and an insulating layer covering the conductive layer, and at least a part of the solder member is located between a first insulating portion of the insulating layer and a second insulating portion of the insulating layer,
   wherein, in the second direction, the first portion is located between the first insulating portion and the second portion, and
   wherein, in the second direction, the third portion is located between the second insulating portion and the second portion.

28. The apparatus according to claim 25, further comprising a driving device configured to move the rigid printed circuit member relative to the circuit unit.

\* \* \* \* \*